United States Patent
Haran et al.

(10) Patent No.: US 8,829,617 B2
(45) Date of Patent: Sep. 9, 2014

(54) UNIFORM FINFET GATE HEIGHT

(71) Applicant: International Business Machines Corporation, Armonk, NY (US)

(72) Inventors: Balasubramanian S. Haran, Watervliet, NY (US); Sanjay Mehta, Niskayuna, NY (US); Shom Ponoth, Clifton Park, NY (US); Ravikumar Ramachandran, Pleasantville, NY (US); Stefan Schmitz, Ballston Spa, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,948

(22) Filed: Nov. 30, 2012

(65) Prior Publication Data

US 2014/0151801 A1    Jun. 5, 2014

(51) Int. Cl.
*H01L 27/12*    (2006.01)
*H01L 29/786*   (2006.01)
*H01L 21/336*   (2006.01)

(52) U.S. Cl.
USPC ........... 257/347; 257/353; 257/521; 257/527; 257/618; 257/351; 257/623; 257/627; 257/628; 257/331; 257/302

(58) Field of Classification Search
CPC ................ H01L 27/1203; H01L 21/84; H01L 29/66772; H01L 27/12; H01L 27/1214

USPC .......................................................... 257/347
See application file for complete search history.

(56) References Cited

U.S. PATENT DOCUMENTS

| | | | |
|---|---|---|---|
| 6,620,715 B1 * | 9/2003 | Blosse et al. | 438/585 |
| 7,276,763 B2 | 10/2007 | Yeo et al. | |
| 7,488,650 B2 | 2/2009 | Schulz | |
| 7,915,130 B2 | 3/2011 | Saito et al. | |
| 8,114,746 B2 | 2/2012 | Wei et al. | |
| 8,492,282 B2 * | 7/2013 | DeVilliers | 438/703 |
| 2004/0191998 A1 | 9/2004 | Natzle et al. | |
| 2011/0237046 A1 | 9/2011 | Maszara et al. | |
| 2012/0146145 A1 | 6/2012 | Anderson et al. | |

* cited by examiner

*Primary Examiner* — Thao X Le
*Assistant Examiner* — Long Le
(74) *Attorney, Agent, or Firm* — L. Jeffrey Kelly; Matthen C. Zehrer

(57) ABSTRACT

A method including providing a plurality of fins etched from a semiconductor substrate and covered by an oxide layer and a nitride layer, the oxide layer being located between the plurality of fins and the nitride layer, removing a portion of the plurality of fins to form an opening, and forming a dielectric spacer on a sidewall of the opening. The method may also include filling the opening with a fill material, wherein a top surface of the fill material is substantially flush with a top surface of the nitride layer, removing the nitride layer to form a gap between the plurality of fins and the fill material, wherein the fill material has re-entrant geometry extending over the gap, and removing the re-entrant geometry and causing the gap between the plurality of fins and the fill material to widen.

6 Claims, 5 Drawing Sheets

UNIFORM FINFET GATE HEIGHT

BACKGROUND

1. Field of the Invention

The present invention generally relates to integrated circuits, and more particularly to the gate height uniformity of multiple finFET semiconductor devices.

2. Background of Invention

Dimensional uniformity of semiconductor device structures may be desired for optimal functionality. Dimensional variations can affect fabrication and ultimately the reliability of the semiconductor devices, for example finFET devices. Typical process flows used to fabricate finFET devices may produce large variations in gate height. The gate height can vary significantly within a single chip due to a variation in pattern density across the chip. An area of high pattern density may include a plurality of fins whereas an area of low pattern density may include one or two fins. Generally, the gate height measured in areas of low pattern density may be lower than the gate height measured in areas of high pattern density.

Typically, a gate first process flow may include forming fins in a substrate, depositing a gate stack including a high-k dielectric and one or more gate metals, and finally etching the final gate structures. Alternatively, a replacement gate (RG) process flow may include the use of a dummy gate stack. The thickness of the gate stack or the dummy gate stack may vary between areas of high pattern density and areas of low pattern density. It may be understood in the art that active areas may include areas of a chip where one or more semiconductor devices may be formed, whereas non-active areas may include areas of the chip free from semiconductor devices. Furthermore, active areas may have a higher pattern density (e.g. more fins) than non-active areas which may be free of fins.

SUMMARY

According to one embodiment of the present invention, a method is provided. The method may include providing a plurality of fins etched from a semiconductor substrate and covered by an oxide layer and a nitride layer, the oxide layer being located between the plurality of fins and the nitride layer, removing a portion of the plurality of fins to form an opening, forming a dielectric spacer on a sidewall of the opening. The method may also include filling the opening with a fill material, wherein a top surface of the fill material is substantially flush with a top surface of the nitride layer, removing the nitride layer to form a gap between the plurality of fins and the fill material, wherein the fill material has re-entrant geometry extending over the gap, and removing the re-entrant geometry and causing the gap between the plurality of fins and the fill material to widen.

According to another exemplary embodiment, a structure is provided. The structure may include a first plurality of fins and a second plurality of fins etched from a semiconductor substrate, and a fill material located above the semiconductor substrate and between the first plurality of fins and the second plurality of fins, wherein the fill material does not contact either the first plurality of fins or the second plurality of fins.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
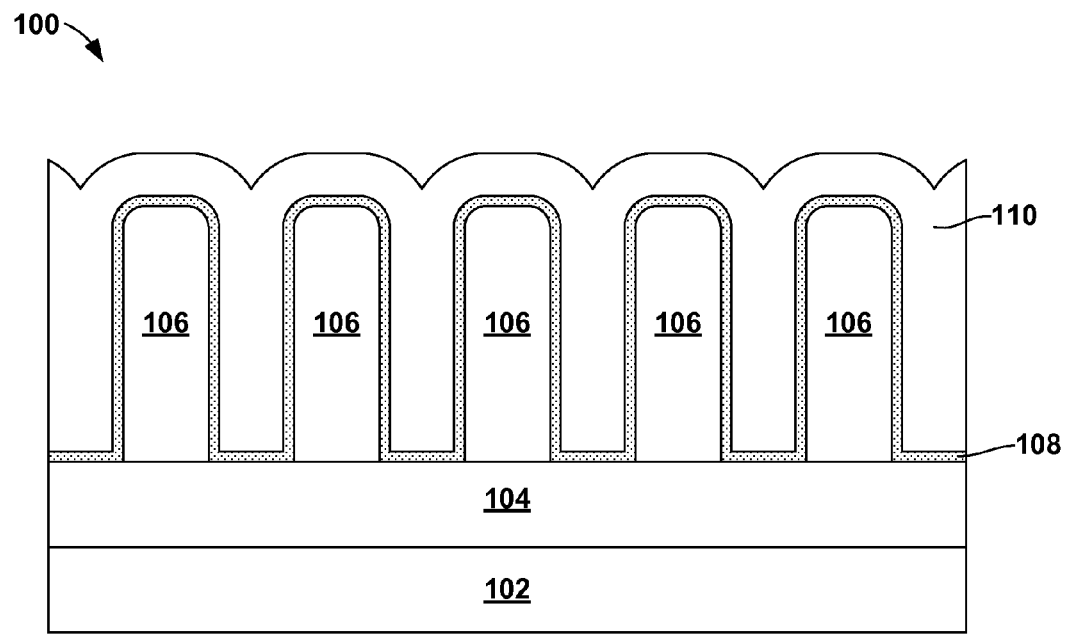
FIG. 1 illustrates a cross-sectional view of a finFET device at an intermediate step of its fabrication according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to the fabrication of finFET devices, and more particularly, to achieving uniform gate heights across multiple groupings of finFETs having varying device densities. The gate height may vary as a result of varying pattern densities, for example, the density of fins patterned in a wafer. It may be advantageous to minimize the variation of gate heights during the formation of finFET devices to reduce subsequent process complexities and improve yield and reliability A finFET device may include a plurality of fins formed in a wafer; a gate covering a portion of the fins, wherein the portion of the fins covered by the gate serves as a channel region of the device and portions of the fins extending out from under the gate serve as source and drain regions of the device; and dielectric spacers on opposite sides of the gate. The present embodiment may be implemented in a gate first or a gate last finFET fabrication process flow, however a gate last, or replacement gate (RG), process flow will be relied upon for the detailed description below.

In a RG process flow, a semiconductor substrate may be patterned and etched to form fins. Next, a dummy gate may be formed in a direction perpendicular to the length of the fins. For example, the dummy gate may be pattered and etched from a blanket layer of polysilicon. A pair of spacers can be disposed on opposite sidewalls of the dummy gate. Later, the dummy gate may be removed from between the pair of spacers, as by, for example, an anisotropic vertical etch process such as a reactive ion etch (RIE). This creates an opening between the spacers where a metal gate may then be formed. Typical integrated circuits may be divided into active areas and non-active areas. The active areas may include finFET devices. Each active area may have a different pattern density, or a different number of finFET devices.

Referring now to FIGS. 1-8, exemplary process steps of forming a structure 100 in accordance with one embodiment of the present invention are shown, and will now be described in greater detail below. It should be noted that FIGS. 1-8 all represent a cross section view of wafer having a plurality of fins 106 formed in a semiconductor substrate. The cross section view is oriented such that a view perpendicular to the length of the plurality of fins 106 is depicted. Furthermore, it should be noted that while this description may refer to some components of the structure 100 in the singular tense, more than one component may be depicted throughout the figures and like components are labeled with like numerals. The specific number of fins depicted in the figures is for illustrative purposes only.

Referring now to FIG. 1, a cross section view of the structure 100 is shown at an intermediate step during the process flow. At this step of fabrication, the structure 100 may generally include the plurality of fins 106, etched from a substrate, having an oxide layer 108 and a nitride layer 110 deposited thereon.

The semiconductor substrate may include a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In the embodiment shown in FIG. 1 a SOI substrate may be used. The SOI substrate may include a base substrate 102, a buried dielectric layer 104 formed on top of the base substrate 102, and a SOI layer (not shown) formed on top of the buried dielectric layer 104. The buried dielectric layer 104 may isolate the SOI layer from the base substrate 102. It should be noted that the plurality of fins 106 may be etched from the uppermost layer of the SOI substrate, the SOI layer.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may have a thickness ranging from 0.5 mm to about 1.5 mm.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer, for example the plurality of fins 106, may include any of the several semiconductor materials included in the base substrate 102. In general, the base substrate 102 and the SOI layer may include either identical or different semiconducting materials with respect to chemical composition, dopant concentration and crystallographic orientation. In one particular embodiment of the present invention, the base substrate 102 and the SOI layer include semiconducting materials that include at least different crystallographic orientations. Typically the base substrate 102 or the SOI layer include a {110} crystallographic orientation and the other of the base substrate 102 or the SOI layer includes a {100} crystallographic orientation. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN®(Epitaxial Layer TRANsfer). It may be understood by a person having ordinary skill in the art that the plurality of fins 106 may be etched from the SOI layer. Because the plurality of fins 106 may be etched from the SOI layer, they too may include any of the characteristics listed above for the SOI layer.

The oxide layer 108 may include a silicon oxide or a silicon oxynitride. In one embodiment, the oxide layer 108 can be formed, for example, by thermal or plasma conversion of a top surface of the SOI layer into a dielectric material such as silicon oxide or silicon oxynitride. In one embodiment, the oxide layer 108 can be formed by the deposition of silicon oxide or silicon oxynitride by chemical vapor deposition (CVD) or atomic layer deposition (ALD). The oxide layer 108 may have a thickness ranging from about 1 nm to about 10 nm, although a thickness less than 1 nm and greater than 10 nm may be acceptable. In one embodiment, the oxide layer 108 may be about 5 nm thick.

The nitride layer 110 may include any suitable insulating material such as, for example, silicon nitride. The nitride layer 110 may be formed using known conventional deposition techniques, for example, low-pressure chemical vapor deposition (LPCVD). In one embodiment, the nitride layer 110 may have a thickness ranging from about 5 nm to about 100 nm. In one embodiment, the nitride layer 110 may be about 50 nm thick.

Figure 2:
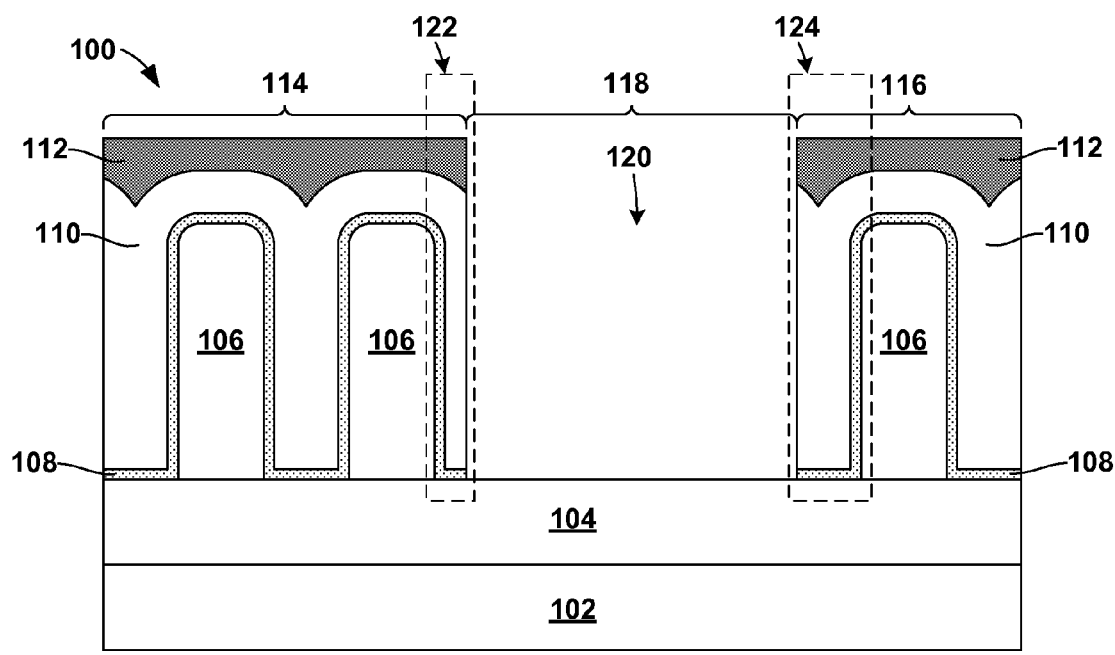
FIG. 2 illustrates the removal of fins to form a non-active area of a chip according to an exemplary embodiment.

Referring now to FIG. 2, a mask layer 112 may be applied above the structure 100 and used to form one or more active areas and one or more non-active areas, for example a first active area 114, a second active area 116, and a non-active area 118. The mask layer 112 can be a soft mask such as photoresist or a hardmask such as an oxide. The mask layer 112 may cover and protect the first and second active areas 114, 116 while the plurality of fins 106, the oxide layer 108, and the nitride layer 110 located in the non-active area 118 may be removed. The plurality of fins 106, the oxide layer 108, and the nitride layer 110 of the non-active area 118 may be removed using any suitable non-selective etching technique such as dry etch, wet etch, or combination of both. For example, a dry etching technique using a $C_xF_y$ based etchant may be used to remove the plurality of fins 106, the oxide layer 108, and the nitride layer 110 from the non-active area 118. The preferred etching technique will remove the plurality of fins 106, the oxide layer 108, and the nitride layer 110 from the non-active area 118 using a single removal technique, and may produce an opening 120. In one embodiment, the plurality of fins 106, the oxide layer 108, and the nitride layer 110 may be individually removed in alternate etching steps. Preferably, the mask layer 112 may be aligned such that a suitable amount of the nitride layer 110 remains on a sidewall of the plurality of fins 106 located in the first and second active areas 114, 116. However, alignment of the mask layer 112 may result in some etch error in turn leaving an insufficient amount of the nitride layer 110 along a first edge 122 of the first active area 114, as designated in the figure. Conversely, the etch error, for example the error in edge placement, may leave a more than suitable amount of the nitride layer 110 along a second edge 124 of the second active area 116.

Figure 3:
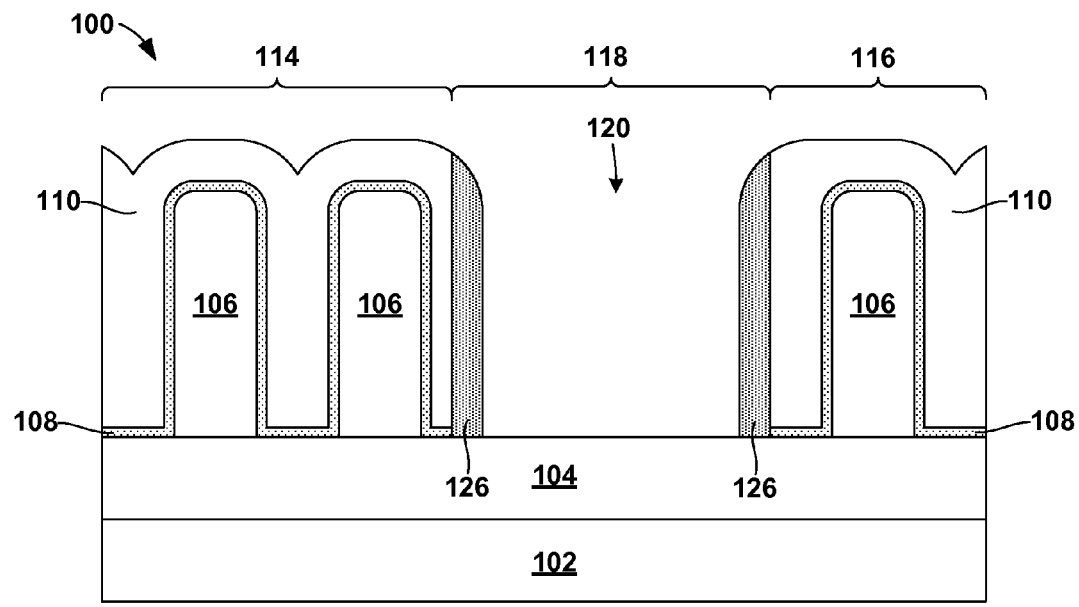
FIG. 3 illustrates the formation of a pair of dielectric spacers according to an exemplary embodiment.

Referring now to FIG. 3, one or more dielectric spacers may be formed along the sidewalls of the non-active areas, for example a pair of dielectric spacers 126 may be formed along the sidewalls of the opening 120. The pair of dielectric spacers 126 may typically be used to ensure a suitable amount of dielectric material protects the plurality of fins 106 of the first and second active areas 114, 116. More specifically, the pair of dielectric spacers 126 may be formed to add a suitable amount of dielectric material to any area of the first or second active areas 114, 116 where an insufficient amount of dielectric material remains, for example along the first edge 122 shown in FIG. 2.

The pair of dielectric spacers 126 may be formed by conformally depositing or growing a dielectric, followed by a directional etch that removes the dielectric from the horizontal surfaces of the structure 100 while leaving it on the sidewalls of the opening 120. In one embodiment, the pair of dielectric spacers 126 may include any suitable nitride. In one embodiment, the pair of dielectric spacers 126 may have a horizontal width, or thickness, ranging from about 3 nm to about 30 nm, with 10 nm being most typical. In one embodiment, the pair of dielectric spacers 126 may include a similar material as the nitride layer 110. Typically, the pair of dielectric spacer 126 may include a single layer; however, the pair of dielectric spacers 126 may include multiple layers of dielectric material.

Figure 4:
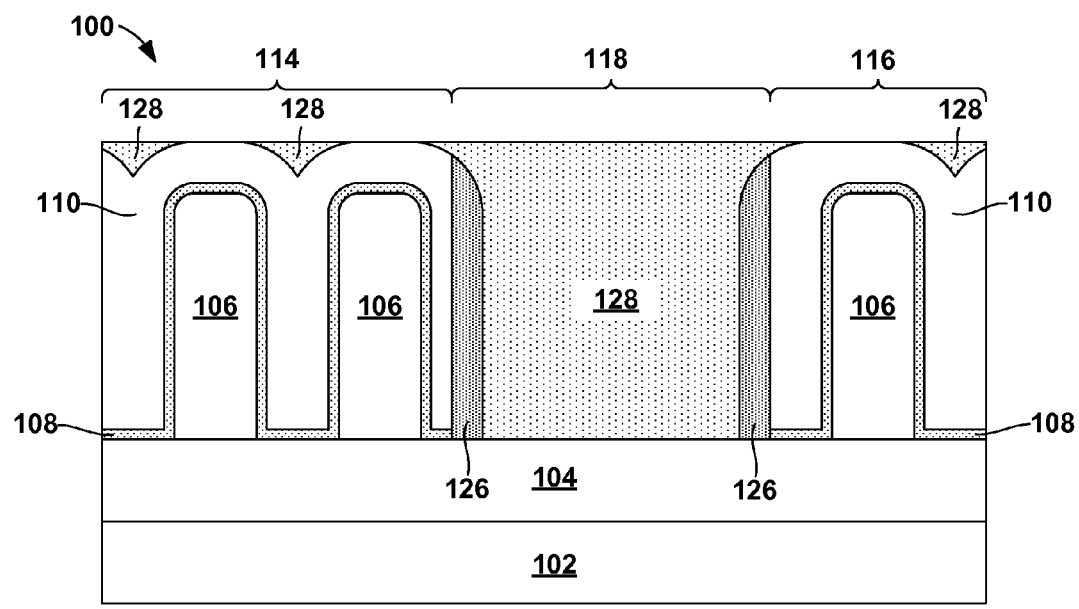
FIG. 4 illustrates the deposition of a fill material according to an exemplary embodiment.

Referring now to FIG. 4, a fill material 128 may be deposited on top of the structure 100 using any suitable deposition technique known in the art. The fill material 128 should serve to fill in the non-active areas, for example the non-active area 118. In one embodiment, the fill material 128 may include any suitable oxide material know in the art. In one embodiment, the fill material 128 may include a high aspect ratio oxide deposited using a CVD deposition technique. The fill material 128 may have a thickness ranging from about 50 nm to about 1000 nm. In one embodiment, the fill material 128 may have a thickness ranging from about 200 nm to about 600 nm. Preferably, the fill material 128 may have a thickness greater than the height of the nitride layer 110.

After being deposited on top of the structure 100, the fill material 128 may be planarized using a CMP technique. The CMP technique may remove some of the fill material 128 selective to the nitride layer 110. In one embodiment, the CMP technique may use a ceria based slurry to recess the fill material 128. Before being polished, the fill material 128 may be non-planar due to variations in pattern density. For example, see FIG. 9. The CMP technique used to polish the fill material 128 may be designed to improve planarity and may advantageously eliminate the non-planer surface of the fill material 128 caused by the variations in pattern density.

Figure 5:
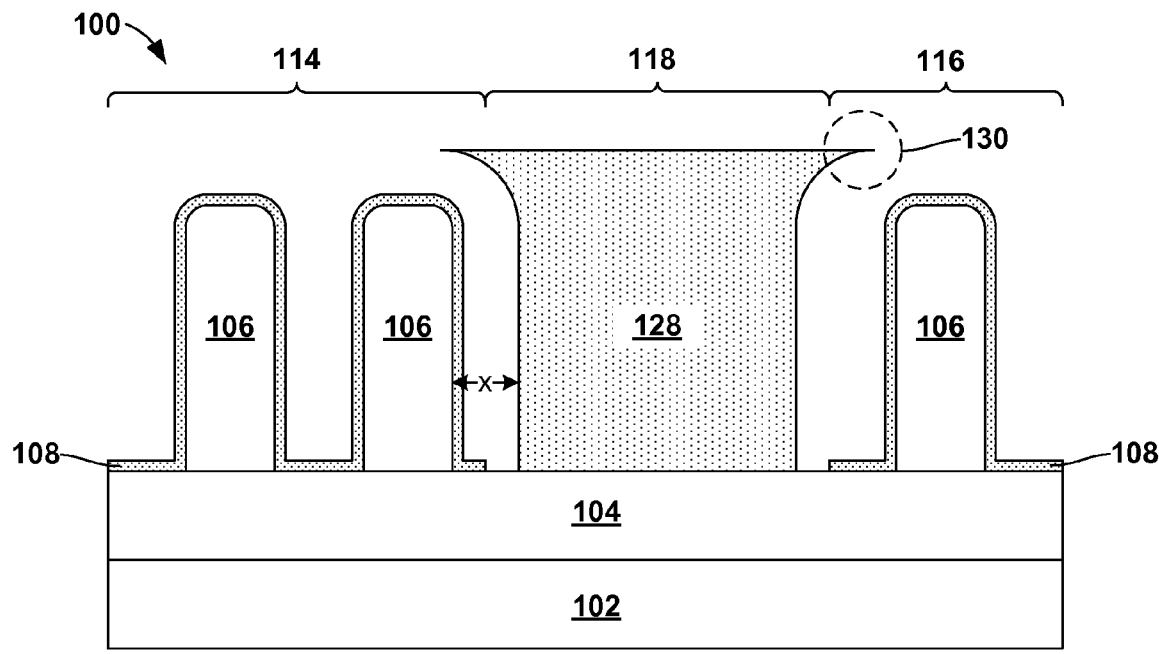
FIG. 5 illustrates the removal of a nitride layer according to an exemplary embodiment.
Figure 6:
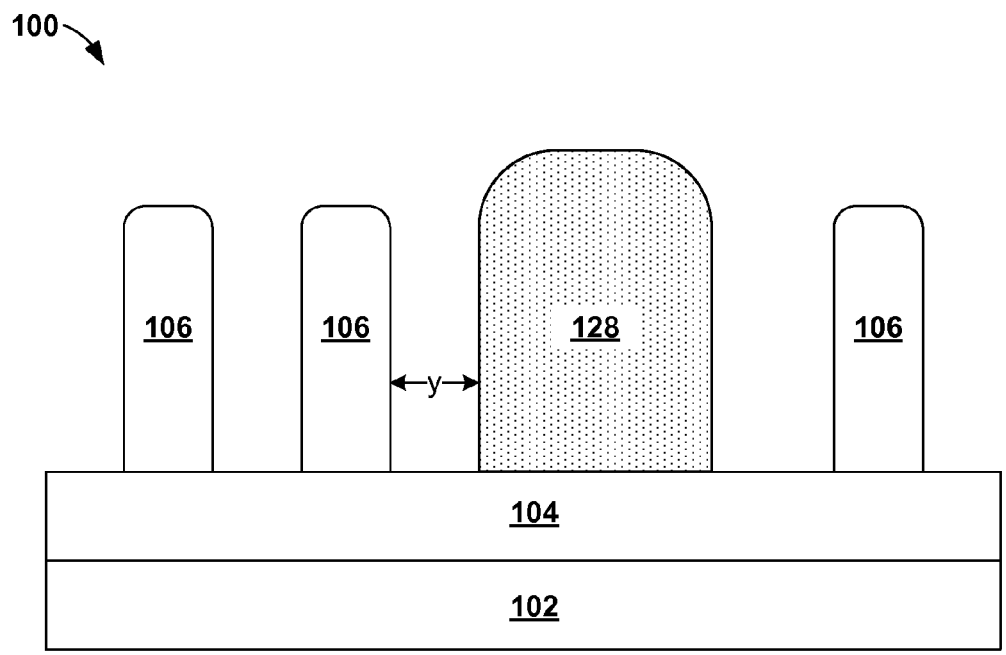
FIG. 6 illustrates a first etching technique used to remove a re-entrant feature formed in the fill material consistent with the removal of the nitride layer and remove an oxide layer from atop the fins according to an exemplary embodiment.

Referring now to FIG. 5, the nitride layer 110 may be selectively removed such that the oxide layer 108 and the fill material 128 remain. The selective removal may be accomplished by using any known etching technique suitable to remove nitride selective to oxide. In one embodiment, a hydrofluoric acid deglaze followed by a wet etching technique using a hot phosphorous etchant may be used to remove the nitride layer 110. Removal of the nitride layer 110 may result in the fill material 128 having a re-entrant geometry 130. The re-entrant geometry 130 may prevent uniform gate formation in turn causing device reliability issues. The re-entrant geometry 130 may impede the subsequent formation of a reliable gate structure because the re-entrant geometry may prevent the conformal deposition of a gate material. Furthermore, the re-entrant geometry 130 may also prevent the removal of the dummy gate material. Either residual dummy gate material or insufficient gate material coverage may affect device performance and reliability Referring now to FIG. 6, a first etching technique may be applied to address the undesirable re-entrant geometry 130 of the fill material 128, and remove some or all of the oxide layer 108. Preferably the cleaning technique may remove the re-entrant geometry 130. In one embodiment, a known chemical oxide removal (COR) etching technique may be used to remove the re-entrant geometry 130.

The COR technique used may include exposing the structure 100 to a gaseous mixture of HF and ammonia, preferably in a ratio of 2:1, at a pressure between 1 mTorr and 10 mTorr and a temperature of about 25° C. During this exposure, the HF and ammonia gases react with the fill material 128 to form a solid reaction product. The solid reaction product may be subsequently removed by heating the structure to a temperature of about 100° C., thus causing the reaction product to evaporate. Alternatively, the reaction product may be removed by rinsing the structure 100 in water, or removing it with an aqueous solution.

In addition to removing the re-entrant geometry 130, the COR technique may also etch a sidewall of the fill material 128. This may effectively reduce a width of the fill material 128 and increase the space between the plurality of fins 106 and the fill material 128. For example, the space may be defined by the dimensions (x) in FIG. 5 and (y) in FIG. 6, where (y) is larger than (x).

Figure 7:
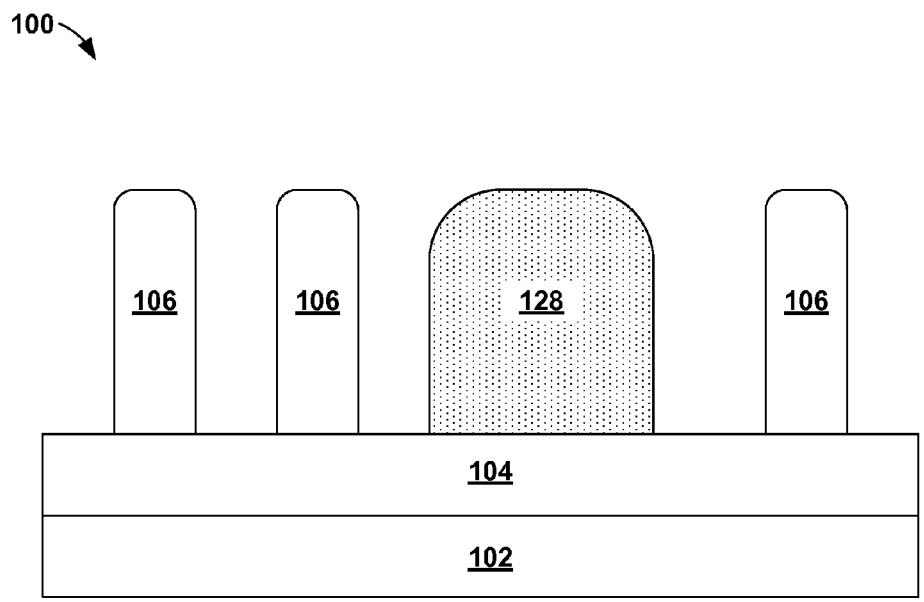
FIG. 7 illustrates a second etching technique used to remove any residual oxide layer according to an exemplary embodiment.

Referring now to FIG. 7, after removing the undesirable re-entrant geometry 130 a second etching technique may be used to remove any residual material of the oxide layer 108 from above the plurality of fins 106. The remaining portions of the oxide layer 108 may be removed using any known etching technique suitable to remove oxide. In one embodiment, a wet etching technique using a hydrofluoric acid etchant may be used to remove the oxide layer 108. Removal of the oxide layer 108 may result in the fill material 128 being further recessed such that a top surface of the fill material 128 may be substantially flush with a top surface of the plurality of fins 106.

Figure 8:
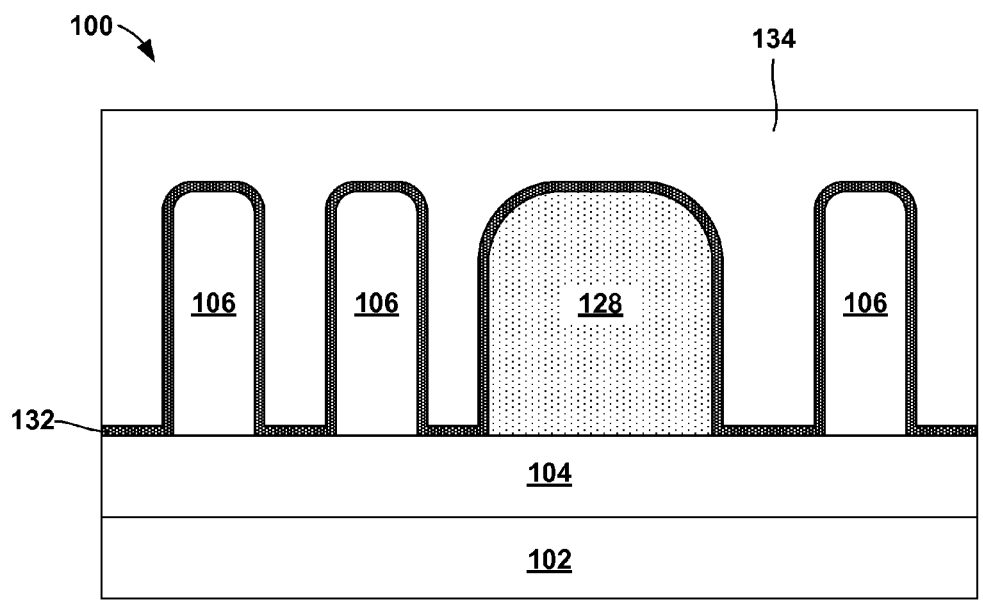
FIG. 8 illustrates the formation of a gate according to an exemplary embodiment.

Referring now to FIG. 8, next, in a RG process flow a gate may be formed on the structure 100, and typical fabrication techniques may be used to complete the formation of the semiconductor devices. The RG process flow may include the formation of a gate oxide 132 and a dummy gate material 134. In most cases the dummy gate material 134 may be sacrificial and replaced in a subsequent operation. In some cases the gate oxide 132 may be sacrificial and replaced in a subsequent operation.

Figure 9:
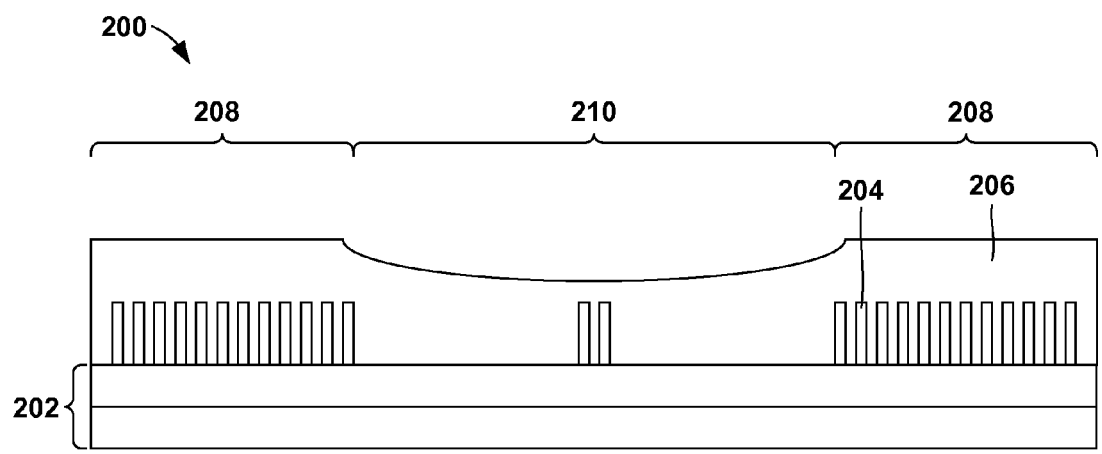
FIG. 9 illustrates the affect varying pattern densities have on the planarity of a blanket gate material according to an exemplary embodiment.

Referring now to FIG. 9, a cross section view of a structure 200 having varying pattern densities is shown. The structure 200 may include a substrate 202, fins 204, and a blanket gate material layer 206. The gate material layer may include a blanket dummy gate material as used in a RG process flow, or a blanket layer of gate material as used in a gate first process flow. Furthermore, the structure 200 may include regions of high pattern density, for example regions 208, and regions of low pattern density, for example regions 210. As mentioned above regions of high pattern density may include a larger number of fins as opposed to regions of low pattern density.

The affect pattern density may have on the planarity of the blanket gate material layer 206 is shown. The thickness or height of the blanket gate material layer 206 may be thicker, or taller, in the regions of high pattern density. It should be noted that an oxide layer, like the oxide layer 108 depicted in FIGS. 1-8, is omitted from FIG. 9 for illustrative purpose only.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   providing a plurality of fins etched from a semiconductor substrate and covered by an oxide layer and a nitride layer, the oxide layer being located between the plurality of fins and the nitride layer;
   removing a portion of the plurality of fins to form an opening;
   forming a dielectric spacer on a sidewall of the opening;
   filling the opening with a fill material, wherein a top surface of the fill material is substantially flush with a top surface of the nitride layer;
   removing the nitride layer to form a gap between the plurality of fins and the fill material, wherein the fill material has re-entrant geometry extending over the gap; and
   removing the re-entrant geometry and causing the gap between the plurality of fins and the fill material to widen.

2. The method of claim 1, further comprising:
   removing the oxide layer; and
   recessing the fill material such that the top surface of the fill material is substantially flush with a top surface of the fins.

3. The method of claim 2, further comprising:
   forming a gate above and between the plurality of fins and the fill material.

4. The method of claim 1, wherein forming the gate comprises using a gate first or a replacement gate process flow.

5. The method of claim 1, wherein filling the opening with a fill material comprises depositing an oxide.

6. The method of claim 1, wherein providing a plurality of fins etched from a semiconductor substrate comprises providing a bulk substrate or a semiconductor-on-insulator substrate.

* * * * *